United States Patent [19]

Busca et al.

[11] Patent Number: 4,947,137

[45] Date of Patent: Aug. 7, 1990

[54] PASSIVE FREQUENCY STANDARD

[75] Inventors: Giovanni Busca, Bevaix; Leland Johnson, La Chaux-de-Fonds, both of Switzerland

[73] Assignee: Oscilloquartz S.A., Neuchatel, Switzerland

[21] Appl. No.: 316,835

[22] Filed: Feb. 28, 1989

[30] Foreign Application Priority Data

Feb. 29, 1988 [FR] France ............................. 88 02593

[51] Int. Cl.$^5$ ................... H01S 1/06; H03B 17/00; H03L 7/26
[52] U.S. Cl. ................................ 331/94.1; 331/3
[58] Field of Search ........................... 331/94.1; 1/3

[56] References Cited

U.S. PATENT DOCUMENTS 3,584,292  6/1971  Dehmelt ........................... 331/3 X

FOREIGN PATENT DOCUMENTS 2477766  9/1981  France .
2506531  11/1982  France .

OTHER PUBLICATIONS

Walls, F. L., "Characteristics and Performance of Miniature NBS Passive Hydrogen Masers", *IEEE X–Oninstrumentation and Measurement*, vol. IM-36, No. 2, Jun. 87, pp. 596–603.

*Laser Focus*, vol. 18, No. 2, Feb. 82, pp. 18, 20, "Laser Diode Improves Lifetime and Accuracy of Atomic Clocks".

Jechart, E., "Rubidium–Gaszellenfrequenznormal In Miniature Ausfuhrung", *Elektronik*, vol. 22, No. 12, 1974, pp. 457–460.

*Proceedings of the 40th Annual/Frequency Symposium 1986*, Philadelphia, Pa., pp. 470–473, IEEE; Weidemann, W., "Subminiature Rubidium Oscillator Model FRS".

*Primary Examiner*—David Mis
*Attorney, Agent, or Firm*—Sughrue, Mion, Zinn, Macpeak & Seas

[57] ABSTRACT

The passive frequency standard of this invention comprises a cell (42) containing Rb87 and a source of predetermined spectral component which, by optical pumping, empties the level $F=1$, $m_F=0$ and populates the level $F=2$, $m_F=0$. This source comprises a lamp (40) and an isotopic filter constituted by Rb 85 contained in the cell (42). A helicoidal resonator (44) is tuned to the transition frequency between level $F=2$, $m_F=0$ and level $F=1$, $m_F=0$. It receives an excitation signal for stimulating such transition from an oscillator via a connector (64). The frequency of the oscillator is slaved to the transition frequency by slave means comprising a photoelectric cell (46) which receives the light from the lamp (40) through the cell (42).

14 Claims, 3 Drawing Sheets

PASSIVE FREQUENCY STANDARD

This invention concerns a passive frequency standard such as the frequency standards of the gas cell or passive maser type.

It relates in particular to a structure of the interrogation means of the frequency standard which permits reducing the volume of such frequency standard.

BACKGROUND OF THE INVENTION

Passive frequency standards comprise in a known manner storage means, subjected to a uniform static magnetic field, for storing atomic or molecular elements in gaseous form, means for producing a population inversion by putting these elements into a predetermined energy level, an interrogation means for stimulating at a predetermined frequency a transition of the energy level of such elements and slave means for controlling the frequency of the interrogation means as a function of a signal depending on the radiation emitted by the stimulated transition.

The general principle of operation of frequency standards and in particular passive frequency standards is particularly described in the article "Les Horloges Atomiques" by C. Steiner, which appeared in the February/March 1967 issue of the review "La Suisse Horlogere" published by the Chambre Suisse de l'Horlogère.

Embodiments of a passive atomic frequency standard using a gas cell and a passive maser are described respectively in Swiss patent document CH-A-40 370 and U.S. Pat. No. 4,316,153.

By way of example of a known passive frequency standard, there will now be described an atomic frequency standard employing a gas cell having reference to FIG. 1.

This frequency standard essentially comprises an optical pumping arrangement 10, a quartz oscillator 12 and an electronic circuit 14 which compares the resonance frequency of the atomic system to that of the oscillator for the slaving of the latter.

In the arrangement 10 there is produced by optical pumping a population inversion between the hyperfine levels of the ground state of the atoms which are generally alkali metals such as potassium, sodium or rubidium. In the case of a frequency standard using rubidium, a standard optical pumping set up is the following.

A cell 16 contains the isotope Rb 87 the spectrum of which comprises the two hyperfine components A and B. The cell is illuminated by a rubidium 87 lamp 18 through a filter 20 which contains the isotope Rb 85 the absorption spectrum of which includes the hyperfine components a and b. The components A and a exist practically in coincidence, while the components B and b are completely separated. The component A of the emission spectrum of lamp 18 is thus eliminated by the filter 20 in a manner such that the light which attains cell 16 is for the most part constituted by the band B. Only the atoms of Rb 87 of cell 16 situated in the lower hyperfine level ($F=1$) absorb light and are transported into higher states. They return by spontaneous emission either to the upper hyperfine level ($F=2$) or to the lower hyperfine level. Since these atoms are immediately excited by the arrival of the light, the lower level ($F=1$) is depopulated to the benefit of the upper level ($F=2$). There is thus brought about the population inversion between these two levels and thereby cell 16 becomes practically transparent to radiation from lamp 18.

Cell 16 is arranged in a microwave cavity 22 which is excited to a frequency close to 6835 MHz, corresponding to the separation energy of the hyperfine levels $F=1$, $m_F=0$ and $F=2$, $m_F=0$ which brings about the hyperfine transition accompanied by an emission of electromagnetic radiation between these two levels. As soon as the atoms which participate in the stimulated emission arrive at the lower hyperfine level ($F=1$), they are optically pumped and transported into the excited states.

The greater the number of stimulated transitions, the greater will be the quantity of light absorbed in cell 16, the smaller will be the quantity of light arriving at the photoelectric cell 24 and the smaller the current will be in photoelectric cell 24. Therefore, the photoelectric current goes through a minimum when the frequency of the excitation signal of the cavity is exactly equal to the transition frequency.

The quartz oscillator 12 produces a signal at 5 MHz. This signal is modulated in a phase modulator 26 to a relatively low frequency (typically on the order of 100 Hz) produced by a low frequency generator 28.

The modulated signal is applied to a multiplier synthesizer 30 to obtain a signal having the stimulated emission frequency of 6835 MHz. It is this signal which is employed in order to excite the microwave cavity 22.

The signal furnished by the photoelectric cell 24 is received by an amplifier 32, then applied to a phase comparator 34 which also receives a reference signal from the generator 28 in a manner to bring about a synchronous detection enabling determination of whether the carrier frequency of the signal applied to cavity 22 is well centered on the hyperfine transition frequency (6835 MHz). Any shifting is indicated by an error signal at the output of the phase comparator 34. This signal is sent to an integrator 36, then employed in order to control a variable capacitor 38 coupled to the oscillator 12 and which modifies the frequency of the latter so as to maintain the multiplied frequency of the quartz centered onto the frequency of the hyperfine transition of the rubidium.

The classic frequency standard shown on FIG. 1 includes a cylindrical resonant cavity 22. The latter constitutes a limitation to the miniaturization of the frequency standard.

Effectively, the resonant cavity must have dimensions largely superior to those of the cell in order that the latter is subjected to an essentially axial field. Furthermore, the dimensions of the resonant cavity may not be freely chosen, but depend, to the contrary, on the desired resonance frequency.

FIG. 1 illustrates the general structure of a passive frequency standard of the gas cell type. Passive masers exhibit the same type of limitation as far as miniaturization is concerned. Effectively, the optical pumping arrangement is replaced in passive masers by an arrangement comprising a storing bulb pierced with an opening and placed into a resonant cavity, a source of gas such as atomic hydrogen emitting a beam of particles towards the opening of the storage flask and a state selector means placed within the trajectory of the beam and which deviates the particles which are not in a predetermined energy state. One thus obtains a population inversion in the storing bulb. The arrangement also comprises a coupling loop for detecting radiation emitted by the stimulated emission.

Passive masers and gas cells thus both include a resonant cavity which limits the miniaturization possibilities for these frequency standards.

The purpose of the invention is to render passive frequency standards more compact. This purpose is attained by a new structure of the resonant means.

BRIEF SUMMARY OF THE INVENTION

Precisely stated, the object of the invention is a passive frequency standard comprising storage means, subjected to a uniform static magnetic field for storing atomic or molecular elements in the form of a gas, inversion means for producing in said storage means elements having a first energy state, interrogation means for stimulating at a predetermined frequency a transition of the energy level of the elements having the first energy level, and slaving means for controlling the predetermined frequency of the interrogation means as a function of a signal depending on the radiation emitted by said stimulated transition, such frequency standard being characterized in that the interrogation means comprises a helicoidal resonator in which is placed the storage means.

The resonance frequency of the helix depends on its pitch p (or on its lead angle $\Psi$), its diameter D and its length L. The same resonance frequency may thus be obtained with different helices. This enables choosing in each case the best adapted form of helix.

The characteristics and advantages of the invention will be better understood from the description to follow given by way of non-limiting illustration and having reference to the attached drawings.

DESCRIPTION OF THE PREFERRED EMBODIMENT

Figure 2:
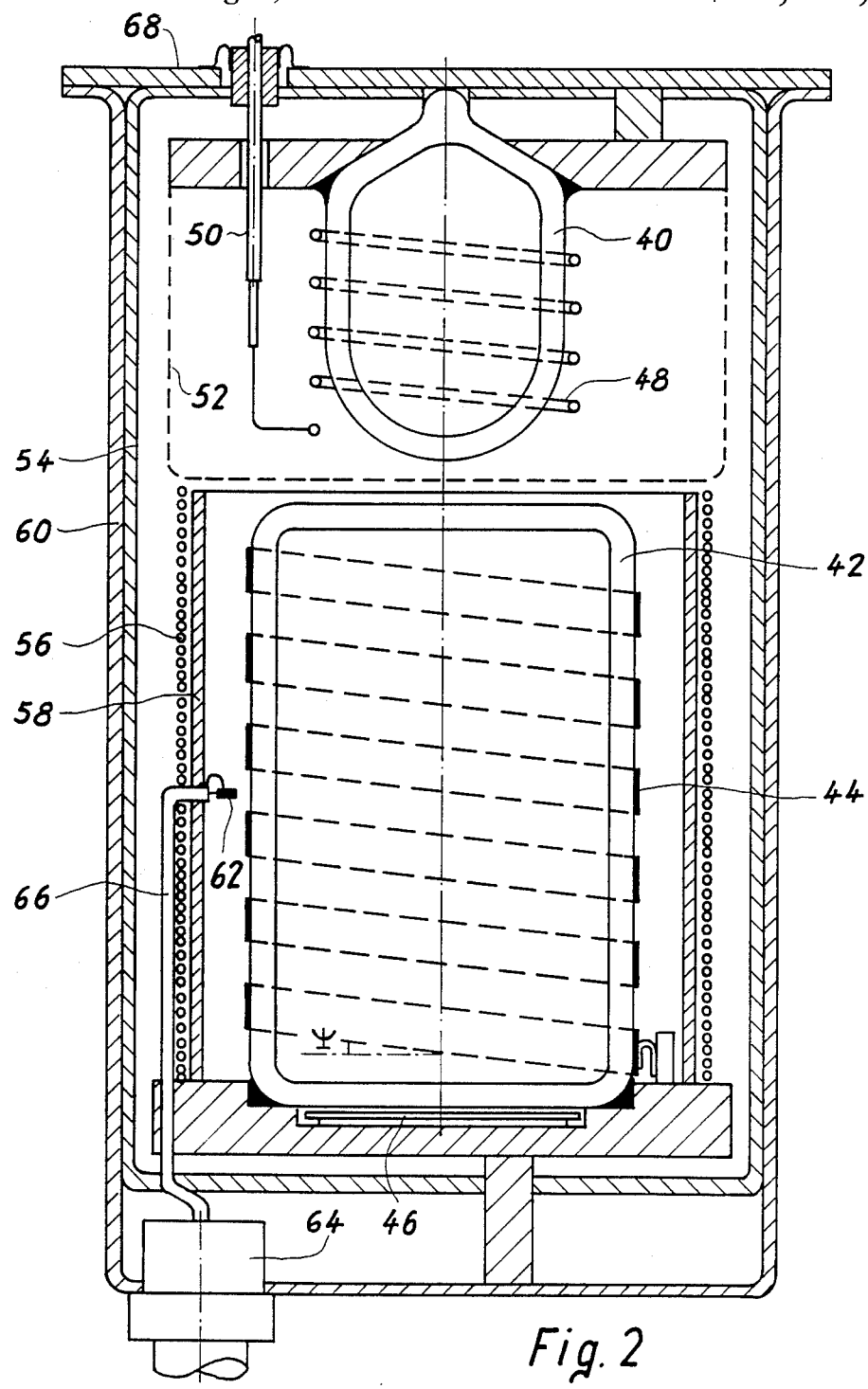
FIG. 2, is a cross-section of an optical pumping arrangement for a frequency standard using a gas cell according to the invention.

The arrangement according to the invention as shown on FIG. 2 comprises essentially a lamp 40, a gas cell 42, a helicoidal resonator 44 and a photoelectric cell 46.

Lamp 40 contains mainly Rb 87 as well as argon at a pressure of 2 Torr serving as triggering gas. It is placed within an excitation coil 48 coupled to a coaxial cable 50 which receives from a radio frequency oscillator a signal having a frequency comprised between about 100 and 150 MHz. A grid 52 is arranged about the assembly in order to avoid radiation of the signal toward the gas cell and the photoelectric cell.

A standard heating circuit (not shown) comprising a heating resistance and a temperature sensor is employed to maintain the lamp at its normal operating temperature.

The gas cell 42 is placed facing lamp 40. In the example as shown this cell contains Rb 85 and Rb 87 as well as a buffer gas which may be a mixture of nitrogen at a partial pressure of 8 Torr and methane at a partial pressure of 5 Torr. It has a diameter of 16 mm and a length of 25 mm, i.e. a volume of about 5 cm$^3$.

Figure 1:
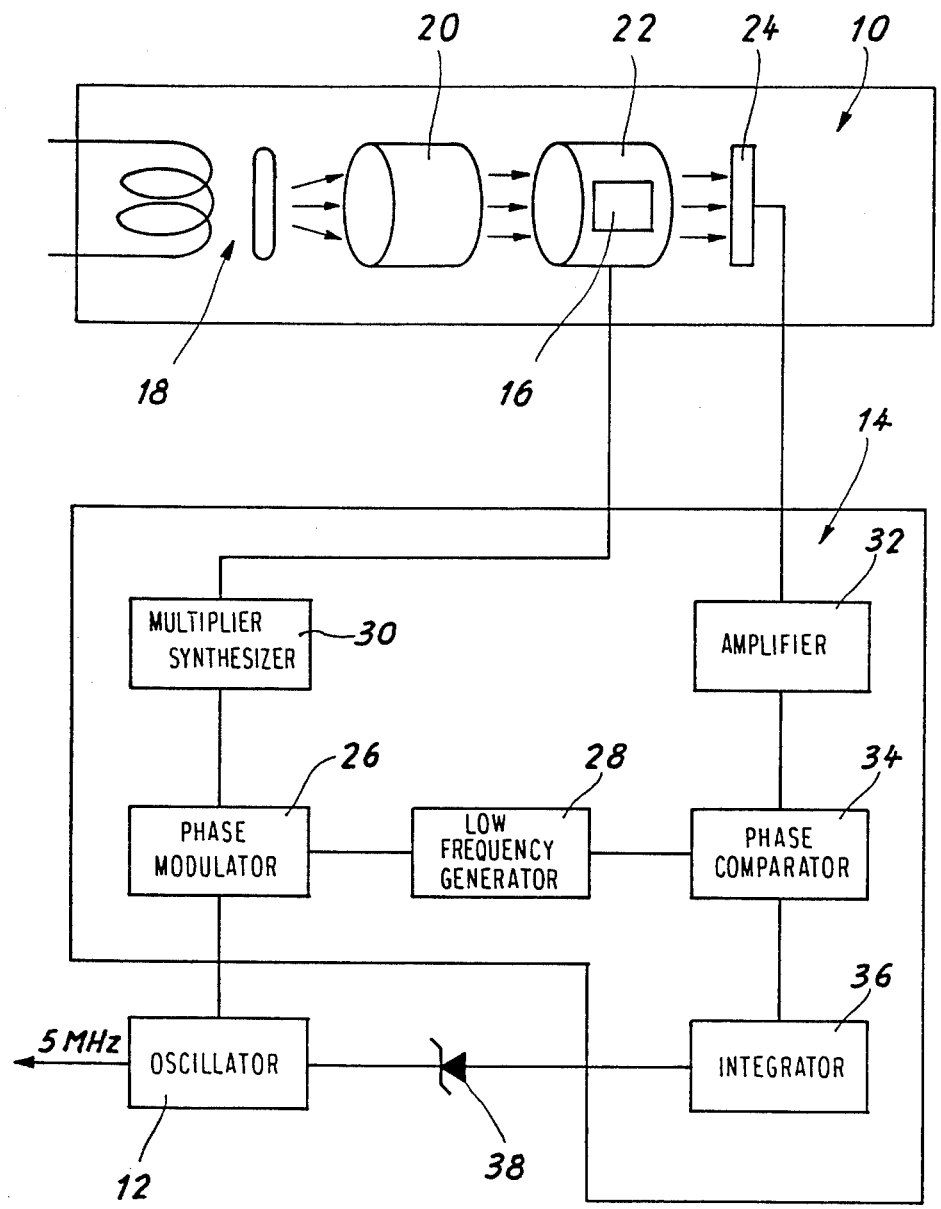
FIG. 1, already described, shows schematically a passive frequency standard according to the prior art.

This cell constitutes at the same time the isotopic filter and the absorption cell of the optical pumping arrangement of FIG. 1.

The atoms of Rb 85 situated in the portion of cell 42 closest to lamp 40 absorb the spectral component A of the latter which brings about filtering and the atoms of Rb 87 located in the part of cell 42 furthest from lamp 40 absorb the spectral component B of the latter, this bringing about the optical pumping.

As is well understood, it is likewise possible to employ an isotopic filter and absorption cell which are separated but the embodiment shown on FIG. 2 presents the advantage of being more compact.

In every case, cell 42 is provided with classic means (not shown) for heating and temperature control in order to maintain the temperature at its normal operating value.

A variant of the embodiment, likewise advantageous because of its reduced volume, consists in replacing lamp 40 by a laser diode. Effectively the latter has a spectrum which is sufficiently narrow so as to contain only the spectral component B. The isotopic filter which serves to absorb the component A is then no longer necessary. One may thus reduce the dimensions of cell 42.

Cell 42 is protected from exterior magnetic fields by a magnetic screen 54. Cell 42 is subjected to a uniform static magnetic field created by a winding 56 and a radiofrequency magnetic field created by interrogation means which in conformity with the invention, comprises a helicoidal resonator 44. This radiofrequency magnetic field is confined by conductive screen 58.

The resonance frequency is a function of the geometry of the helix. For instance, the length L is determined by the relation $L=(2n+1)\cdot(\lambda/4)\cdot k\cdot tg\Psi$, where $\lambda$ is the resonance wave length in a vacuum, $\Psi$ is the lead angle of the helix, n is an integer and k is a coefficient close to 1 and which takes into account the conductive screen 58.

Thus, a resonance frequency of 6835 MHz, i.e. $\lambda=4.39$ cm, which corresponds to the hyperfine transition frequency of the level F=2, $m_F=0$ to the level F=1, $m_F=0$ for the atoms of Rb 87 is obtained with L=17.9 mm for n=7 and $\Psi=5.7°$. One thus determines that it is possible to construct a helical resonator having dimensions comparable to those of the cell. This enables a substantial volume reduction with reference to known frequency standards comprising a resonant cavity.

Figure 3:
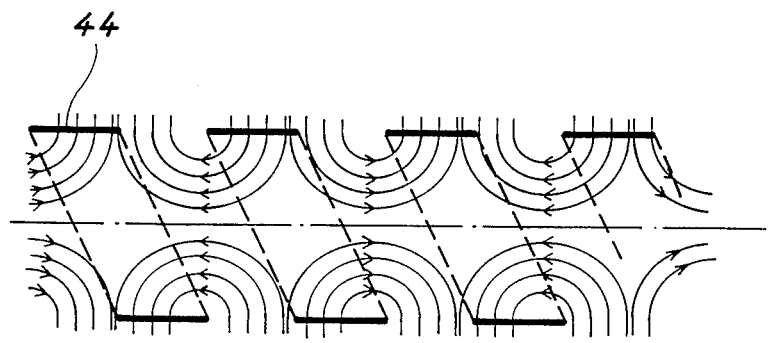
FIG. 3 illustrates the distribution of the magnetic field in the helicoidal resonator and FIG. 4 shows schematically a passive maser comprising an interrogation means according to the invention.

There has been shown schematically on FIG. 3 the distribution of the magnetic field in the helical resonator. One may determine that this field is essentially axial. The filing factor of the resonator is thus high since the cell may efficiently occupy the entire volume of the resonator.

The resonator may be applied to cell 42 as shown on FIG. 2; this may be brought about for instance by vacuum evaporation of a metal. The resonator may also be placed around the cell without contacting the latter.

The helicoidal resonator 44 is excited by a microwave loop 62 arranged in a plane perpendicular to the axis of the helix and energized by an exterior oscillator via a connector 64 and a coaxial cable 66. Loop 62 may comprise a SRD diode (step recovery diode) which multiplies the frequency of the signal furnished by the oscillator and which thus permits the employment of an oscillator of relatively low frequency.

The absorption of the spectral component B by the atoms of RB 87 in cell 42 is detected by the photoelectric cell 46. This absorption signal is employed in a well known manner to slave the frequency of the interrogation signal emitted by loop 62 to the hyperfine transition frequency of the level F=2, $m_F=0$ to the level F=1 $m_f=0$ of the Rb 87.

Experiments have shown that the long term drift of the frequency standard shown on FIG. 2 is less than $10^{-11}$ per month. In the same manner, the short term frequency stability $\sigma(\tau)$ (ALLAN variance) is better than $5.10^{-12}.\tau^{-\frac{1}{2}}$ for $1 < \tau < 100$ seconds.

The arrangement according to the invention shown on FIG. 2 exhibits a volume of about 35 cm³ (diameter of 3 cm and length of 5 cm). This permits reducing the warm up time to about 1 min. in order to attain a frequency error less than $5.10^{-10}$.

The container formed by envelope 60 and cover 68 may be advantageously placed under vacuum. This provides several advantages relative to the prior art, in which the lamp and the cell are not under vacuum.

Firstly, the thermal flux due to convection between lamp 40 and cell 42 (the respective temperatures which are for instance about 140° C. and 80° C.) is eliminated which enables a precise control of both temperatures.

Secondly, placing the container under vacuum enables placing the lamp and the cell closer together without risk, this bringing about an additional reduction in the volume of the container.

Thirdly, the temperature range and the frequency stability within this range are improved. The arrangement according to the invention has a temperature range of −55° C. to +75° C., with a frequency stability of $3.10^{-10}$ over this range, i.e. $2.3 \; 10^{31} \; 12/°$ C.

Fourthly, placing under vacuum enables diminishing the power consumption. The arrangement according to the invention shown on FIG. 2 has a power consumption of 7 W.

There has been shown on FIG. 2 a frequency standard using a gas cell comprising in conformity with the invention, a helicoidal resonator. Such resonator may be likewise employed in other passive frequency standards such as a passive maser as has been shown schematically on FIG. 4.

The latter comprises essentially a gas source 72, a state selector 74, storing bulb 76, a detection loop 78 and an interrogation loop 80 placed in a container 70 under vacuum. The storing bulb 76 is insulated from exterior magnetic fields by a magnetic screen 82; it is subjected to a uniform static magnetic field generated by a winding 86 and to a magnetic field at the resonance frequency produced by a helicoidal resonator 88 according to the invention and confined by a conductive screen 84.

Loop 78 is coupled at the outside of container 70 to a servo means 90 which slaves the frequency of an oscillator 92, the signal of which is applied to loop 80.

The gas source 72 emits toward the opening of the storing bulb 76 a jet of atoms or molecules which are generally of atomic hydrogen or of an alkali metal. The state selector 74 generates an inhomogeneous magnetic field which eliminates by divergence atoms or molecules which are not in the desired energy state.

For instance the case of atomic hydrogen, the state selector 74 eliminates the atoms which are in the lower energy state $f=0$, $m_F=0$. The atoms attaining the storing bulb are those which are in the higher energy states $F=1$, $m_F=0$ or $+1$. One thus obtains a population inversion in the storing bulb.

The stimulated transition from the state $F=1$, $m_F=0$ to the state $F=0$, $m_F=0$ is set off by the resonator excited by the oscillator. The resonance frequency is adjusted to 1420 MHz by choosing suitable values for the pitch p, the diameter D and the length L of the helix.

Figure 4:
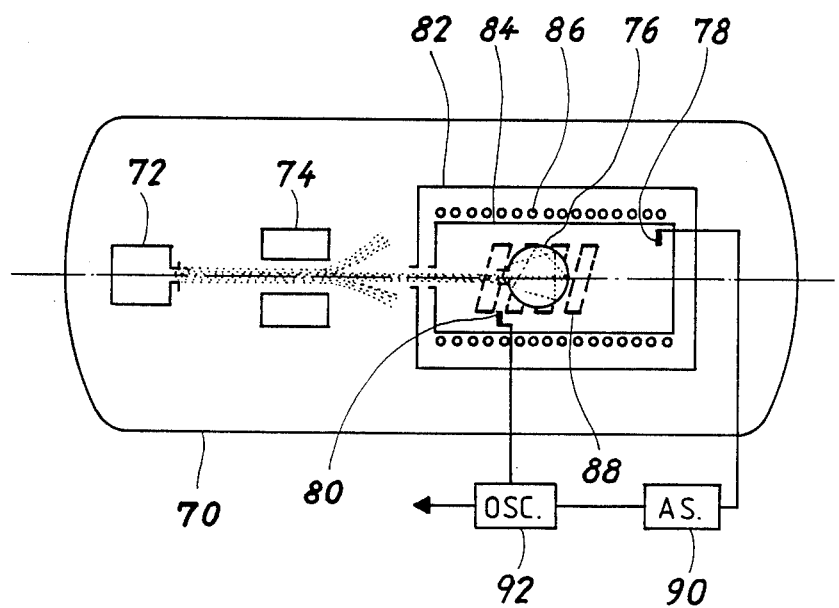

The passive maser shown on FIG. 4 functions according to the same principle as the gas cell frequency standard shown on FIG. 2. The only differences reside in the method of effecting the population inversion and in the nature of the detection means employed.

What we claim is:

1. A passive frequency standard comprising storage means, subjected to a uniform static magnetic field, for storing atomic or molecular elements in gaseous form, inversion means for producing elements within the storage means having a first energy state, interrogation means for stimulating at predetermined frequency a transition of energy level of the elements having said first energy level and slave means for controlling the predetermined frequency of said interrogation means as a function of a signal depending from the radiation emitted by said stimulated transition, said interrogation means comprising a helicoidal resonator and said storage means being situated within said helicoidal resonator.

2. A passive frequency standard as set forth in claim 1 wherein said interrogation means comprises a conductive loop carrying a periodic electric signal the frequency of which is equal to said predetermined frequency.

3. A passive frequency standard as set forth in claim 1 wherein said interrogation means comprises a conductive loop and an SRD diode in series therewith carrying a periodic electric signal the frequency of which is equal to said predetermined frequency or to a sub-multiple of said predetermined frequency.

4. A passive frequency standard as set forth in claim 1 of the gas cell type wherein said storage means is a cell containing an alkali metal in gaseous form and wherein said inversion means comprises a light source having a predetermined spectral component which produces a population inversion within said cell by optical pumping.

5. A passive frequency standard as set forth in claim 4 wherein said light source comprises a laser diode.

6. A passive frequency standard as set forth in claim 5 wherein said storage means contains Rb 87 and a gas buffer.

7. A passive frequency standard as set forth in claim 4 wherein said light source comprises an alkali metal vapour lamp and an isotopic filter.

8. A passive frequency standard as set forth in claim 7 wherein said alkali metal vapour lamp comprises an Rb87 lamp, said filter including an Rb85 cell and the cell forming the storage means containing Rb87.

9. A passive frequency standard as set forth in claim 8 which has a single cell containing Rb85, Rb87 and a buffer gas.

10. A passive frequency standard as set forth in claim 4 wherein said light source, said storage means and the helicoidal resonator of said interrogation means are placed in a container under vacuum.

11. A passive frequency standard as set forth in claim 4 wherein said slave means includes a photoelectric cell adapted to detect the light of predetermined spectral composition which has traversed the storage means.

12. A passive frequency standard as set forth in claim 1 of the passive maser type wherein said storage means includes an opening and wherein said inversion means comprises a source of gas and a state selector means for directing elements at said first energy level into said storage means.

13. A passive frequency standard as set forth in claim 12 wherein said source of gas emits atomic hydrogen.

14. A passive frequency standard as set forth in claim 13 wherein said slave means includes a coupling conductive loop for detecting the radiation emitted by said stimulated transition.

* * * * *